United States Patent [19]
Lang et al.

[11] Patent Number: 5,657,157
[45] Date of Patent: Aug. 12, 1997

[54] SEMICONDUCTOR OPTICAL AMPLIFYING MEDIA WITH REDUCED SELF-FOCUSING

[75] Inventors: Robert J. Lang, Pleasanton; Julian S. Osinski, Palo Alto; David F. Welch, Menlo Park, all of Calif.

[73] Assignee: SDL, Inc., San Jose, Calif.

[21] Appl. No.: 494,255

[22] Filed: Jun. 23, 1995

[51] Int. Cl.$^6$ ..................................................... H01S 3/00
[52] U.S. Cl. ............................................. 359/344; 372/44
[58] Field of Search .............................. 372/44, 46, 50; 359/344

[56] References Cited

U.S. PATENT DOCUMENTS

| | | | |
|---|---|---|---|
| Re. 35,215 | 4/1996 | Waarts et al. | 372/108 |
| 4,791,647 | 12/1988 | Lindsey et al. | 372/44 |
| 5,095,489 | 3/1992 | Nagai et al. | 372/49 |
| 5,101,413 | 3/1992 | Botez | 372/50 |
| 5,159,604 | 10/1992 | Mehuys et al. | 372/50 |
| 5,172,387 | 12/1992 | Fink | 372/68 |
| 5,199,038 | 3/1993 | Vahala et al. | 372/33 |
| 5,208,822 | 5/1993 | Haus et al. | 372/50 |
| 5,231,642 | 7/1993 | Scifres et al. | 372/45 |
| 5,276,700 | 1/1994 | Jansen et al. | 372/50 |
| 5,349,602 | 9/1994 | Mehuys et al. | 372/98 |
| 5,392,308 | 2/1995 | Welch et al. | 372/92 |
| 5,537,432 | 7/1996 | Mehuys et al. | 372/50 |

OTHER PUBLICATIONS

Paxton, A.H. et al., "Filament formation in semiconductor gain regions," *J. Appl. Phys.*, vol. 70, No. 6, Sep. 15, 1991, pp. 2921–2925.

Dutta, N.K. et al., "Linewidth enhancement factor in strained quantum well lasers," *Appl. Phys. Lett.*, vol. 56, No. 23, Jun. 4, 1990, pp. 2293–2294.

Green, C.A. et al., "Linewidth enhancement factor in InGaAsP/InP multiple quantum well lasers," *Appl. Phys. Lett.*, vol. 50, No. 20, May 18, 1987, pp. 1409–1410.

Hinton, Kerry, "Optical Carrier Linewidth Broadening in a Traveling Wave Semiconductor Laser Amplifier," *IEEE Journal of Quantum Electronics*, vol. 26, No. 7, Jul., 1990, p. 1176–1182.

Lang, Robert J. et al., "Spontaneous Filamentation in Broad–Area Diode Laser Amplifiers," *IEEE Journal of Quantum Electronics*, vol. 30, No. 3, Mar., 1994, p. 685–694.

Lang, Robert J. et al., "Spatial evolution of filaments in broad area diode laser amplifiers," *Appl. Phys. Lett.*, vol. 62, No. 11, Mar. 15, 1993, pp. 1209–1211.

Manning, Joanne et al., "The Carrier–Induced Index Change in AlGaAs and 1.3 μm InGaAsP Diode Lasers," *IEEE Journal of quantum Electronics*, vol. QE–19, No. 10, Oct., 1983, pp. 1525–1530.

(List continued on next page.)

*Primary Examiner*—Mark Hellner
*Attorney, Agent, or Firm*—Thomas Schneck

[57] ABSTRACT

A semiconductor light amplifying medium has reduced self-focusing and optical filamentation for providing higher power coherent outputs in broad-area laser and amplifier devices. In one embodiment, a longitudinally inhomogeneous active region has alternating segments of first gain portions and second compensating portions. The compensating portions have a negative self-focusing parameter [∂n/∂P] and may be light absorbing (negative gain) regions with negative antiguiding factor α or light amplifying (positive gain) regions with positive antiguiding factor α. The α-parameter is defined as the ratio of refractive index change per change in gain, as a function of carrier density. In a second embodiment, the medium may have longitudinally varying peak filament period so that filaments beginning to form in one portion of the active region are subsequently dispersed in a succeeding portion, slowing filament growth. In addition to self-focusing compensation, media with a lower α-parameter are provided by increasing the barrier height in quantum well active regions, straining or p-doping the active region, or a combination of these methods.

64 Claims, 5 Drawing Sheets

OTHER PUBLICATIONS

Schöenfelder, A. et al., "Differential Gain, Refractive Index, and Linewidth Enhancement Factor in High-Speed GaAs-Based MQW Lasers: Influence of Strain and p-Doping," *IEEE Photonics Technology Letters*, vol. 6, No. 8, Aug. 1994, pp. 891–893.

Vahala, K. et al., "On the linewidth enhancement factor $\propto$ in semiconductor injection lasers," *Appl. Phys. Lett.*, vol. 42, No. 8, Apr. 15, 1983, pp. 631–633.

Henry, Charles H., "Phase Noise in Semiconductor Lasers," *Journal of Lightwave Technology*, vol. Lt-4, No. 3, Mar. 1986, pp. 298–311.

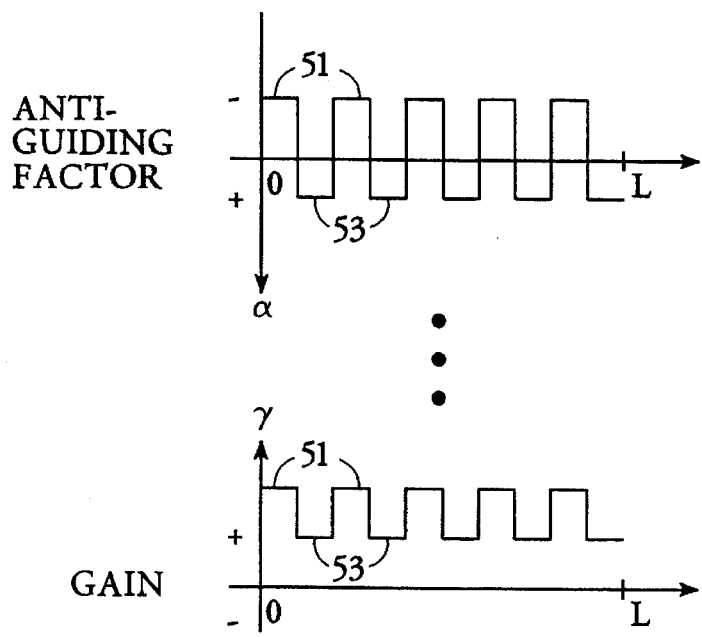
FIG. 6A
FIG. 6B
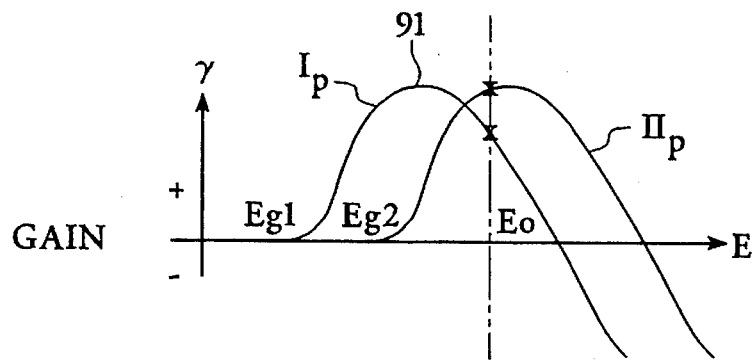
FIG. 7A
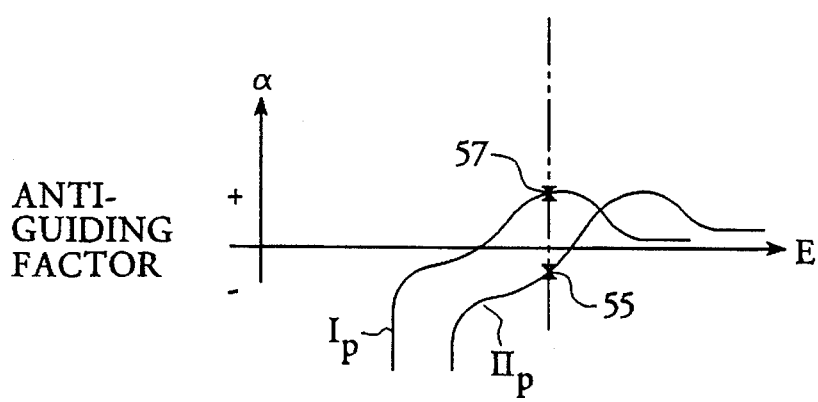
FIG. 7B

SEMICONDUCTOR OPTICAL AMPLIFYING MEDIA WITH REDUCED SELF-FOCUSING

Statement as to Rights to Inventions made under Federally-Sponsored Research and Development The invention was made with government support under contract no. F-29601-92-C-0008 awarded by the U.S. Air Force. The government has certain rights in the invention.

TECHNICAL FIELD

The present invention relates to semiconductor lasers and optical amplifiers, especially those adapted to provide high power (at least 1 W cw) output, and in particular relates to materials and structures for such lasers and amplifiers for reducing or suppressing self-focusing or optical filamentation.

BACKGROUND ART

Semiconductor lasers and amplifiers are valued for their small size, low cost, robustness, high efficiency and a wide range of available wavelengths. However, it has proved to be very difficult to obtain both high power and good spatial coherence from such devices. Single-stripe devices are known to produce high quality output beams, but are generally limited to at most a few hundred milliwatts of output power, at which point any further increase of the optical intensity at the output facet begins to affect device reliability. Broad-area lasers and amplifiers show great promise for reliably producing higher output powers, but suffer from modal instabilities, collectively known as optical filamentation, that seriously degrade the spatial coherence of their output beams. For example, simple Fabry-Perot broad-area lasers do not exhibit diffraction-limited far field outputs at all under cw operation. And while broad-area amplifiers injected with a uniform input beam have been demonstrated that provide quite high diffraction-limited optical power (to date, up to 3.3 W cw and 11.6 W pulsed from diode laser injection and 21 W pulsed from Ti:Sapphire solid-state laser injection), any further improvement in their performance is ultimately limited by the onset of filamentation. It is not surprising then that understanding the causes of filamentation and finding a solution to this problem, in order to attain higher power spatially coherent outputs from broad-area lasers and amplifiers, has been a goal of researchers for many years.

The phenomenon of filamentation has been studied extensively and a number of detailed analyses have been done on the formation and growth of optical filaments in broad-area semiconductor diode lasers and amplifiers. Published studies include A. H. Paxton and G. C. Dente, "Filament formation in semiconductor laser gain regions", *Journal of Applied Physics*, vol. 70, no. 6, 15 Sep. 1991, pages 2921–2925; Robert J. Lang, et al., "Spatial evolution of filaments in broad area diode laser amplifiers", *Applied Physics Letters*, vol. 62, no. 11, 15 Mar. 1993, pages 1209–1211; and Robert J. Lang et al., "Spontaneous Filamentation in Broad-Area Diode Laser Amplifiers", *IEEE Journal of Quantum Electronics*, vol. 30, no. 3, March 1994, pages 685–694. The analyses show that filamentation is a result of an optical nonlinearity characteristic of semiconductor light amplifying media that causes a runaway effect known as self-focusing. In such media, the index of refraction (n) is a function of the optical power (P) propagating through the medium. In particular, the media exhibit a positive change in the refractive index with optical intensity (i.e., $\partial n/\partial P > 0$). Because of this characteristic, any lateral perturbation in the optical field propagating in the medium, in the form of a local increase in the optical intensity, causes a local increase in the index of refraction that tends to focus and further magnify the perturbation. Such self-focused localized regions of increased intensity, commonly called filaments, tend to grow exponentially in intensity as the beam propagates through the medium, and the greater the self-focusing parameter, defined as the ratio of change of index of refraction per change in incident optical power, $\partial n/\partial P$, the more rapid the growth.

The physical mechanism in semiconductor amplifying media which results in this self-focusing effect and the consequent optical filamentation is gain saturation and the spatial hole burning of carriers in combination with a relatively strong dependence of the index of refraction on gain and carrier density. While there is also a thermal component of filamentation due to the relation between local temperature and the refractive index, the primary effect appears to be carrier-based. Semiconductor amplifying media exhibit strong coupling between the gain and refractive index in the medium. This gain-index coupling can be represented by a ratio ($\alpha$), variously known as the antiguiding factor, the linewidth enhancement factor, or the $\alpha$-parameter. The antiguiding factor ($\alpha$) is defined here as the ratio between the change in index of refraction (n) per change in carrier density (N) and the change in gain ($\gamma$) per change in carrier density (N), scaled and normalized to be dimensionless, i.e., $\alpha = (4\pi/\lambda)(\partial n/\partial N)/(\partial\gamma/\partial N)$, where $\lambda$ is the optical wavelength. The antiguiding factor ($\alpha$), as defined here, is generally negative in semiconductor amplifying media. Any increase in gain due to the injection of carriers is accompanied by a significant decrease in refractive index, producing antiguiding of light propagating in the medium. Conversely, any local increase in the optical intensity in the medium depletes the carriers, causing a local decrease in the carrier density and a corresponding local increase in the effective refractive index, which results in self-focusing and a further increase in local intensity. Theoretical models show that the rate at which self-focusing occurs scales with the magnitude of the antiguiding factor. (Readers should note that the published literature provides a variety of definitions for the antiguiding or linewidth enhancement factor $\alpha$, some identical to that given above and some differing from the above definition by a constant or wavelength-dependent proportionality factor. Some definitions include a negative sign so that $\alpha$ will be positive, while others do not.)

As previously noted, broad-area lasers and amplifiers are particularly susceptible to the adverse effects of self-focusing, namely filamentation. In lasers, the regenerative nature of laser oscillation can explain the spontaneous generation of filaments in the near field. In amplifiers subject to external injection, tiny random spatial fluctuations in the optical input grow into filaments as the beam propagates down the amplifier. Such fluctuations are inevitable due to imperfect optics. Small inhomogeneities in the media itself or in the pumping of the media may also contribute to the generation of the intensity perturbations that lead to filaments. Despite the random nature of the input fluctuations, the observed filaments often have a remarkably regular pattern, especially in double-pass amplifiers, because the rate at which periodic perturbations grow varies with the period of the perturbation and depends upon wavelength, saturation, the differential gain and the antiguiding factor in the amplifier. The period of perturbations that experiences the highest rate of growth is called the peak filament period and is typically 5–20 μm in broad-area semiconductor amplifying regions. Because the gain is more completely saturated in double-pass amplifiers, the perturbations generally become so unstable that the optical field collapses into a periodic array of filaments. In any case, the filaments impress both intensity and phase variations upon the optical field, which destroy the spatial coherence of the output beam.

In addition to the loss of beam quality due to filamentation, the gain-index coupling characterized by the $\alpha$-parameter has other undesirable effects that affect even single-stripe devices. These include a substantial linewidth broadening that degrades the spectral purity of the output beam, and a modulation-induced chirp that limits the useful modulation speed of laser diodes well below their fundamental limit. Much of the research regarding the $\alpha$-parameter has been directed toward its effect on devices for optical communication. Linewidth broadening in semiconductor lasers and amplifiers is analyzed by K. Valhala et al. in "On the linewidth enhancement factor $\alpha$ in semiconductor injection lasers", *Applied Physics Letters*, vol. 42, no. 8, 15 Apr. 1983, pages 631–633, and Kerry Hinton in "Optical Carrier Linewidth Broadening in a Traveling Wave Semiconductor Laser Amplifier", *IEEE Journal of Quantum Electronics*, vol. 26, no. 7, July 1990, pages 1176–1182. Valhala et al. note that linewidth broadening is proportional to $(1+\alpha^2)$.

Reductions in the measured value of $\alpha$ have been reported for multiple quantum well (MQW) lasers by C. A. Green, in "Linewidth enhancement factor in InGaAsP/InP multiple quantum well lasers", *Applied Physics Letters*, vol. 50, no. 20, 18 May 1987, pages 1409–1410, strained MQW lasers by N. K. Dutta et al. in "Linewidth enhancement factor in strained quantum well lasers", *Applied Physics Letters*, vol. 56, no. 23, 4 Jun. 1990, pages 2293–2294, and strained and p-doped MQW lasers by A. Schönfelder et al. in "Differential Gain, Refractive Index, and Linewidth Enhancement Factor in High-Speed GaAs-Based MQW Lasers: Influence of Strain and p-Doping", *IEEE Photonics Technology Letters*, vol. 6, no. 8, August 1994, pages 891–893.

In U.S. Pat. No. 5,208,822, Haus et al. disclose a semiconductor laser diode in which the net optical gain or refractive index is kept almost constant under modulation in order to realize a device with reduced chirp. The laser structure has an active region comprising two regions optically coupled to each other with the second region having a higher bandgap energy than the first region. The oscillation wavelength is selected by a feedback grating such that the two regions have $\alpha$-parameters with opposite signs. Separate electrodes for each region provide independent current injection to the two regions. For amplitude modulation, the changes in gain for the two regions have the same sign, so that the changes in refractive index have opposite sign to keep the phase condition in the cavity unchanged for ultra-low chirp. For frequency modulation, net optical gain is kept almost constant by opposite changes in current injection for the two regions, so that the respective changes in refractive index have the same sign, thereby changing the lasing wavelength. Haus et al. disclose a narrow stripe active region and make no mention of either self-focusing or filamentation in broad-area devices.

An object of the invention is to reduce or eliminate the self-focusing and resultant filamentation in broad area semiconductor lasers and amplifiers, thereby providing higher power coherent light output from such devices.

DISCLOSURE OF THE INVENTION

The object is achieved with a semiconductor light amplifying medium, for use in making high power, broad area, semiconductor light emitting laser and amplifier devices with a reduced growth rate of optical filaments, in which the semiconductor material active region of the amplifying medium is either (1) longitudinally inhomogeneous, with the active region divided with alternating segments comprising first gain portions characterized by a positive self-focusing parameter aligned with second compensating portions characterized by a negative self-focusing parameter or a different peak filament period interspersed with the first portions, or (2) composed of material or operated at a wavelength for which the magnitude of the antiguiding factor $\alpha$ is significantly reduced, or (3) includes both low $\alpha$-parameter material and compensation regions. "Broad area" devices include any lasers and amplifiers whose active region (including a flared region) has a lateral dimension or width that is at least ten times broader than the wavelength of the light being amplified and is capable of supporting multiple spatial modes of light propagation, and would therefore be susceptible to self-focusing and filamentation but for the present invention. Light emitting laser and amplifier devices also include monolithic MOPAs that combine both a laser oscillator and an amplifier on a single substrate.

In the spatially inhomogeneous embodiments, the compensation portions of the active region disperse any optical filaments that may begin to form in the gain portions. Compensation portions with a negative self-focusing parameter can be light absorbing regions which are either left completely unpumped or at most biased or electrically pumped independently of the gain portions below the transparency level. Any local intensity increase in these compensation portions will generate a slight excess of carriers due to absorption that will decrease the local refractive index and tend to defocus the nascent filament. In order for the gain in the gain portions to outweigh the loss in the compensation portions, so as to result in a net gain over the entire length of the medium, the antiguiding factor $\alpha$ in the compensation portions should have the same sign as in the gain region, but should exhibit a greater magnitude at the operating wavelength. This may be accomplished by providing a different epitaxial layer structure in the compensation portions, with unstrained quantum wells or lower energy quantum barriers for the active region in those portions, or by providing a larger bandgap energy in the compensation portions by partially disordering the active region in those portions. Then the compensation regions will introduce only a small loss, while providing a large refractive index compensation. Alternatively, instead of using absorbing regions with negative gain, the compensation portions may have an antiguiding factor $\alpha$ of the opposite sign from the gain portions. Then all portions of the active region can have positive gain. This may be accomplished by increasing the bandgap energy of the compensating portions relative to the first gain portions and selecting the operating wavelength where the antiguiding factor $\alpha$ in the gain and compensating portions have opposite sign. Yet another alternative is to provide compensating portions with a different peak filament period from the gain portions. Near saturation, the broad-area amplifying medium favors formation of a periodic array of filaments whose lateral spatial period depends on the antiguiding factor $\alpha$ and the slope of the gain curve versus current density. By proper choice of these parameters, a spatially inhomogeneous filament resonance can be provided such that any filaments that begin to form in one portion of the active region will be dispersed in the succeeding portion.

To create low $\alpha$-parameter media, one can raise the bandgap of the quantum barriers bounding one or more quantum wells of the active region, or of the current confinement or cladding layers bounding an active layer in order to reduce the number of unconfined electrons. Alternatively, one can apply strain to the quantum well active region or to an active layer. This separates the otherwise degenerate pair of valence bands for light and heavy holes, and thereby reduces the asymmetry between the hole and electron energies during pumping with carriers, reducing the number of excess electrons. These excess unpaired electrons contribute to the increase in the refractive index without contributing to gain. The barrier height and other raised bandgap energies, as well as the mechanical strain, may all be provided by an appropriate selection of layer material compositions. For example, an InGaAs quantum well may be used with AlGaAs (instead of GaAs) quantum barriers, provided the growth temperature and reactor flow rates are selected to avoid having to lower the growth temperature at the quantum well or having to interrupt the growth process. Doping a quantum well active region with p-type dopants also offsets the imbalance in the density of states between electrons and holes, and thereby reduces the antiguiding factor $\alpha$. Finally, the operating wavelength can be chosen, with suitable grating reflectors and cavity dimensions in lasers or by injecting light of selected wavelength into the amplifying medium, so as to be shorter than the gain peak of the active region. The antiguiding parameter $\alpha$ generally has a smaller magnitude for shorter wavelengths, i.e. higher photon energies, because a smaller fraction of the carriers in the conduction band of the semiconductor medium is consumed in stimulated emission at those wavelengths, thus raising the refractive index less than at longer wavelengths.

Devices made with such reduced self-focusing media tend also to have reduced quantum efficiency and higher thresholds. However, even though a sacrifice is made in efficiency, significantly higher diffraction-limited power outputs are obtainable because of the reduction in filamentation.

BRIEF DESCRIPTION OF THE DRAWINGS

FIGS. 6a–6b are graphs of antiguiding factor and gain, respectively, along the length of the device of FIG. 2 (or FIG. 1) for a second implementation of gain and compensation portions of the active region.

FIGS. 7a–7b are graphs of gain and antiguiding factor, respectively, versus photon energy illustrating choice of an operating point for executing the second implementation of the gain and compensation portions.

BEST MODE OF CARRYING OUT THE INVENTION

Figure 1:
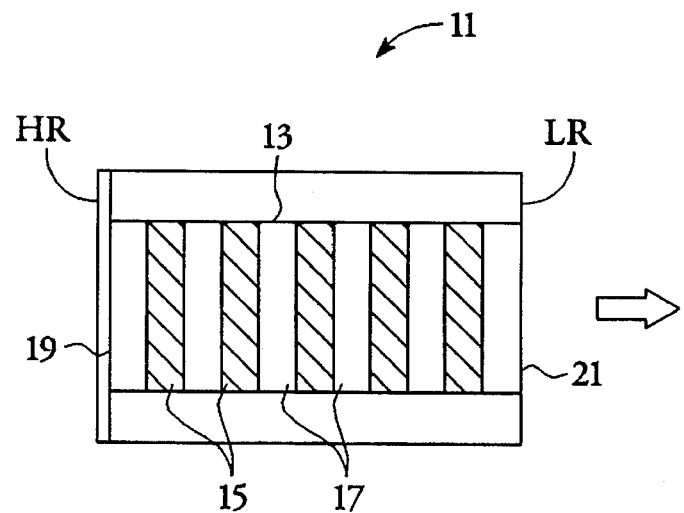
FIG. 1 is a top plan view of a broad-area semiconductor laser with alternating gain and compensation regions.

With reference to FIG. 1, a broad area, semiconductor laser device 11 includes a broad active region 13 which is divided into first gain portions 15 interlaced with second compensation portions 17, to form a longitudinally inhomogeneous active region 13. Reflective end facets 19 and 21 define a resonant cavity for laser oscillation. Other feedback mechanisms such as DFB or DBR grating reflectors might also be used. The laser shown in FIG. 1 is merely representative of the many possible configurations that may employ the inhomogeneous active region 13 in accord with the present invention. Likewise, in FIG. 2, a broad area semiconductor amplifier 23 includes a broad active region 25, in this case a flared region, with alternating gain and compensation portions 27 and 29. The end faces 31 and 33 are antireflection coated in this single-pass embodiment. A double-pass amplifier might also be used. The amplifier 23 is injected with light from a laser source 35, in this case an external semiconductor laser diode. A lens 37 may be used to focus the injected light to a spot at the input facet 31. A monolithic laser oscillator and amplifier configuration (MOPA) might also be constructed.

Figure 2:
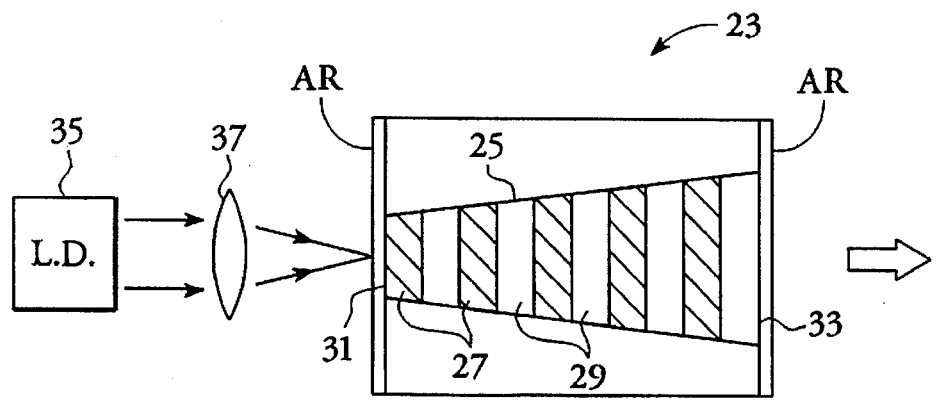
FIG. 2 is a top plan view of a broad-area semiconductor amplifier with alternating gain and compensation regions and external laser injection.
Figure 3:
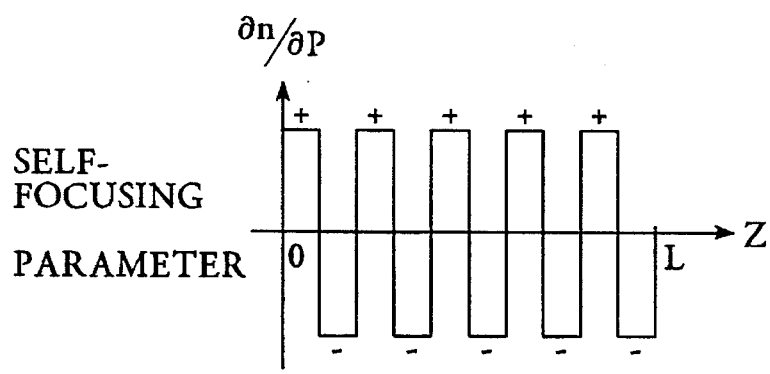
FIG. 3 is a graph of the self-focusing parameter along the length of the broad-area amplifier device of FIG. 2 (alternately, of the laser of FIG. 1).
Figure 10:
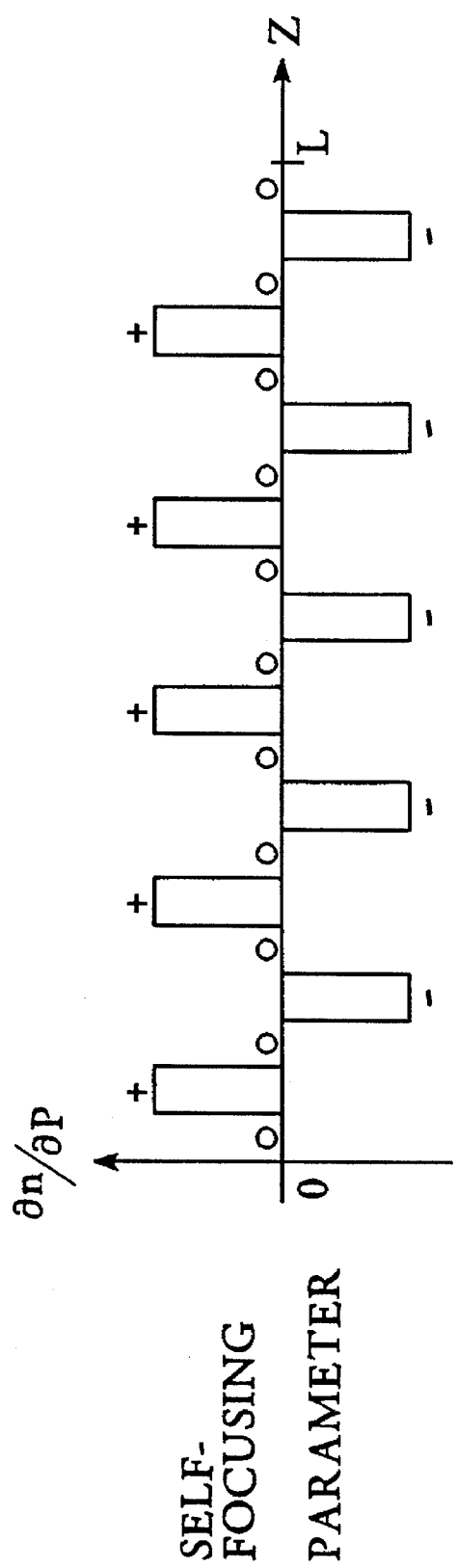
FIG. 10 is a graph of the self-focusing parameter along the length of a broad-area laser or amplifier device with an alternative arrangement of gain and compensating regions from that illustrated by FIG. 3.

FIGS. 3 and 10 show variations along the length of the active region of the self-focusing parameter $\partial n/\partial P$ (where n is the refractive index of the amplifying medium in the active region 13 or 25 and P is the optical power). In the gain portions 15 or 27 of the active region, there is a positive (+) self-focusing parameter, so that there is a tendency for self-focusing and filamentation to arise in such areas. However, interspersed with those gain portions are compensating portions 17 or 29 with a negative (−) self-focusing parameter. Any filaments that do happen to begin forming in one of the gain portions 15 or 27, that is, any lateral increases in optical power density or intensity, produce a corresponding local decrease in the refractive index in the adjacent negative (−) self-focusing parameter portion 17 or 29, that tends to defocus such filaments. In FIG. 3, the gain and compensating portions are adjoining portions of the active region as in FIGS. 1 and 2. However, as seen in FIG. 10, the gain and compensating portions need not be adjoining but could instead be separated by regions (0) with little or no self-focusing parameter, such as transparent window regions. Such window regions could be produced by any of a number of techniques including impurity induced disordering, vacancy induced disordering, etch and regrowth, and laser assisted growth.

The gain and compensating portions need not be the same size. If $\rho$ is the duty cycle for the first gain portions and $(1-\rho)$ is that for the second compensation portions, then the average value of the self-focusing parameter over the entire length of the active region 13 or 25 is:

$$[\partial n/\partial P]_{avg} = \rho[\partial n/\partial P]_1 + (1-\rho)[\partial n/\partial P]_2$$

All that is required is that the average value be sufficiently small (preferably negative) as to reduce or eliminate the self-focusing action of the medium enough to suppress filament growth. That is $[\partial n/\partial P]_{avg} \approx 0$ or $[\partial n/\partial P]_{avg} < 0$.

Figure 4A:
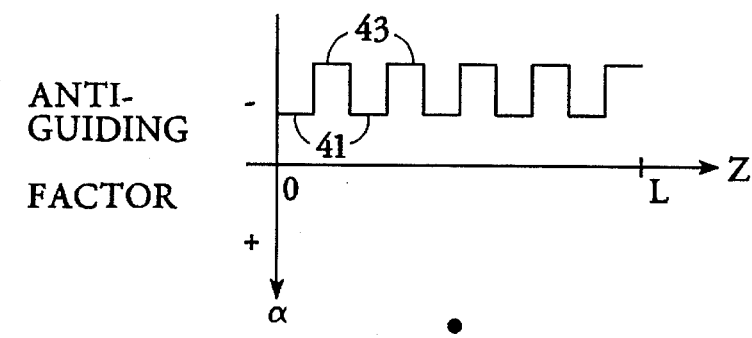
FIGS. 4a–c are graphs of antiguiding factor, gain and bandgap energy, respectively, along the length of the device of FIG. 2 (or FIG. 1), for a first implementation of gain and compensation portions of the active region.
Figure 4B:
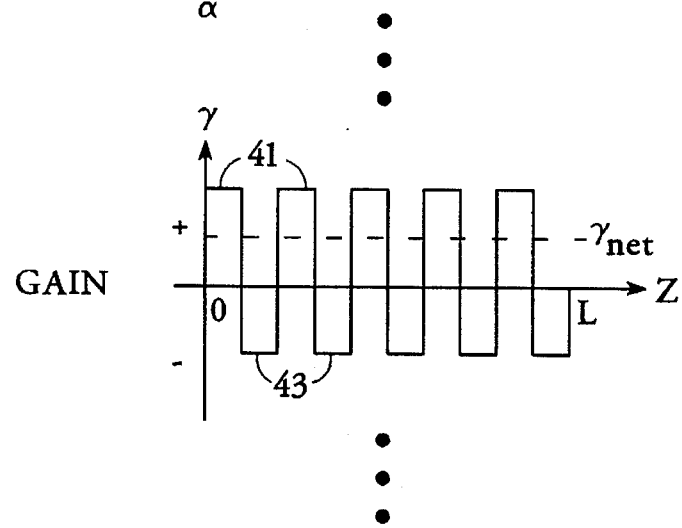

One technique for providing a negative self-focusing parameter value for the compensating portions is to use light absorbing (negative gain) regions for the compensating portions. Referring to FIGS. 4a and 4b, the antiguiding factor α, which has been defined as the change in refractive index (n) per change in gain (γ) as a function of carrier density (N), is the same (negative) for both the light amplifying (gain portions) and light absorbing (compensating portions) regions of the active region, but the gain is positive in the light-amplifying regions 41 and negative in the light absorbing regions 43. In order for the net gain ($\gamma_{net}$) over the entire length (z=0 to L) of the active region to be positive, either the magnitude of the positive gain in regions 41 should exceed the magnitude of the negative gain in regions 43, or the length of the positive gain regions 41 should be greater than the length of the negative gain regions 43, or both. That is:

$$\gamma_{net} = \rho\gamma_1 + (1-\rho)\gamma_2 > 0,$$

where ρ is the duty cycle and $\gamma_1$ is the gain for light amplifying regions 41, (1–ρ) is the duty cycle and $\gamma_2$ is the gain for light absorbing regions 43. Any intensity perturbation that begins to form in a light amplifying region will, when it enters a subsequent light absorbing region, generate a slight excess of carriers by absorption, increasing local gain and decreasing local refractive index, and thus defocus the perturbation. In order for the light absorbing regions 43 to completely compensate for self-focusing in the light amplifying regions 41, the antiguiding factor α must have a greater magnitude in those light absorbing regions 43 than in the light amplifying regions 41. Then the absorbing regions will have a larger index compensation for the same amount of loss or a smaller loss for the same amount of index compensation.

Figure 4C:
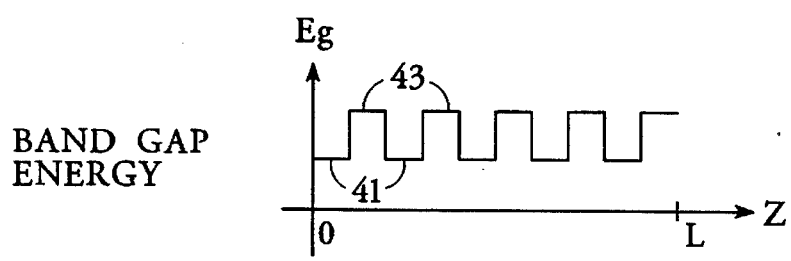
Figure 5:
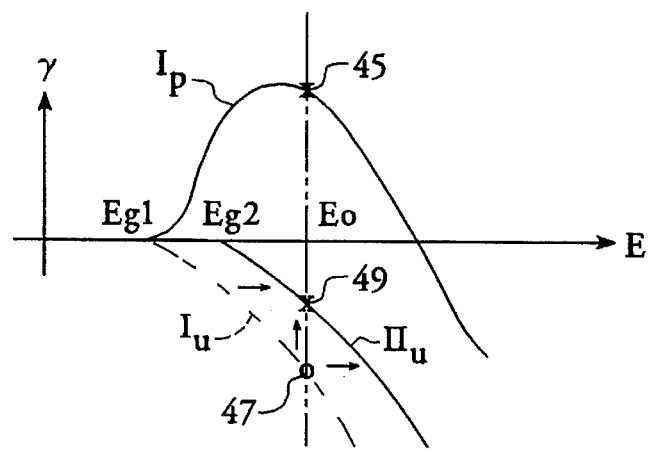
FIG. 5 is a graph of gain versus photon energy for a first pumped gain portion $I_p$ with a first bandgap energy $E_{g1}$, and for a second unpumped compensation portion $II_u$ with a second bandgap energy $E_{g2} > E_{g1}$. The gain for the first portion when unpumped $I_u$ is shown with a dashed curve for comparison with $II_u$.

One way to increase the magnitude of the antiguiding factor α in the light absorbing regions 43 is to longitudinally tailor the bandgap energy so that the absorbing regions 43 have a higher bandgap energy than the amplifying regions 41 as illustrated in FIG. 4c. Referring to FIG. 5, a graph of gain (γ) versus photon energy (E=hc/λ, where h is Planck's constant, c is the speed of light in a vacuum, and λ is the wavelength of the light) shows a positive gain for a pumped first material region $I_p$ for a band of photon energies greater than that first material's bandgap energy $E_{g1}$. If that first material region were to be unpumped or biased below transparency it would show a loss or negative gain for photon energies greater than $E_{g2}$, as indicated by the dashed curve $I_u$. A second material region with a higher bandgap energy $E_{g2}$ also shows a loss, i.e. negative gain, when it is unpumped or biased below transparency, but for photon energies greater than $E_{g2}$, as indicated by curve $II_u$. That is, the loss has been shifted to higher photon energies (shorter wavelengths). For a given operating point $E_o$ of an amplifying medium with both the pumped first material regions $I_p$ and the unpumped second material regions $II_u$, the gain in the first regions at 45 in FIG. 5 can be made to exceed the loss in the second regions at 49 with a bandgap increase to $E_{g2}$, since such a bandgap shift decreases the magnitude of the loss, as seen by a comparison of points 47 and 49 on the curves $I_u$ and $II_u$, respectively. The larger bandgap energy in the absorbing regions may be provided by any of numerous known methods, such as partially disordering the active region layer or layers via impurity-induced or vacancy-induced disordering techniques. Other ways of increasing the antiguiding factor α in the absorbing regions, other than increasing the bandgap energy of the material, include doing the opposite of any of the techniques described below for decreasing the antiguiding factor α. Thus, these light absorbing compensation portions might be provided with a different epitaxial layer composition or structure from the light amplifying gain portions, with unstrained (or reduced strain) quantum wells or lower energy (less confining) quantum barriers in the absorbing regions compared to the strain or barrier height in the amplifying regions.

With reference to FIGS. 6a and 6b, another way of providing the alternating positive and negative self-focusing parameter medium of FIG. 2 is to operate not only the first gain portions 51 of the active medium with positive gain, but also the second compensation portions 53, and to select an operating wavelength where the gain and compensating portions 51 and 53 have opposite antiguiding factors α. As seen in FIG. 6a, the first gain portions 51 have a negative antiguiding factor, while the second compensating portions 53 have a positive antiguiding factor to defocus any filaments that begin to arise in the broad area medium. The compensating portions 53 need not have the same magnitude of gain as the gain portions 51, and, as seen in FIG. 6b, may have a lower gain γ so that the positive antiguiding factor in such portions need not be as large as the negative antiguiding factor in the gain portions to fully compensate for self-focusing.

As seen in FIGS. 7a and 7b, one way to provide portions of the active region with opposite antiguiding factors α is to shift the bandgap energy of the compensating portions relative to the gain portions and to choose the operating wavelength where this opposite antiguiding factor α occurs. In FIG. 7a, the gain versus photon energy for a first pumped material $I_p$ of bandgap $E_{g1}$ and a second pumped material $II_p$ of higher bandgap are shown. The selected operating wavelength corresponds to a photon energy $E_o$. At this operating point the gains in the two materials $I_p$ and $II_p$ need not be identical. Here second material $II_p$, corresponding to the gain portions with negative antiguiding factor α, has the higher gain. In FIG. 7b, the antiguiding factor α for the two materials $I_p$ and $II_p$ are also shown for various photon energies. At the selected operating point, the gain portions of material $II_p$ have a negative antiguiding factor α (at point 55), while compensating portions of material $I_p$ have a positive antiguiding factor α (at point 57) that defocuses any filaments that begin to form in the gain portions.

The embodiments given above compensate for the tendency of the amplifying medium to filament by providing portions with a negative self-focusing parameter while still preserving a net positive gain over the length of the active region. An alternative embodiment reduces filament growth without use of negative self-focusing parameter compensating regions by providing compensating portions in the active region that have a substantially different peak filament period from the primary gain portions. The peak filament period $K_{pk}$ in a self-focusing medium is given by any of the following equations:

$$K_{pk}^2 = (2\pi n_{eff}/\lambda) \cdot (-\alpha) \cdot \gamma \cdot [P/(P+P_{sat})], \quad (1)$$

$$= (2\pi n_{eff}/\lambda) \cdot \alpha \cdot (\partial\gamma/\partial P) \cdot P, \quad (2)$$

where $n_{eff}$ is the effective refractive index in that medium, $\lambda$ is the light wavelength, $\alpha$ is the antiguiding factor, $\gamma$ is the gain, and $P_{sat}$ is the saturation power.

$$P_{sat} = [\sigma \cdot (\partial\gamma/\partial J_\gamma)]^{-1},$$

$$\sigma = (e/hc) \cdot (\lambda/\rho_{int}),$$

where $J_\gamma$ is the equivalent current density needed to sustain a given gain level $\gamma$ when the gain is saturated by the input power, $\rho_{int}$ is the internal quantum efficiency of the medium (typically about 0.95), and e, h and c are fundamental universal constants (electron charge, Planck's constant and the speed of light, respectively). It can be seen from equations (1) and (2) above, that the peak filament period $K_{pk}$ depends on the antiguiding factor $\alpha$ and the slope of the gain versus current density curve $\partial\gamma/\partial J_\gamma$ (or saturation power $P_{sat}$). By providing successive portions of the active region with different filamentation periods, the growth of filaments can be hindered, because the conditions that favor growth of a particular filament in one portion of the active region change so as to favor destruction of that filament in a succeeding portion of the active region. As long as the overall filament growth rate is maintained below the growth rate of the plane wave being amplified in the medium, coherence of the beam will be substantially preserved.

Figure 8A:
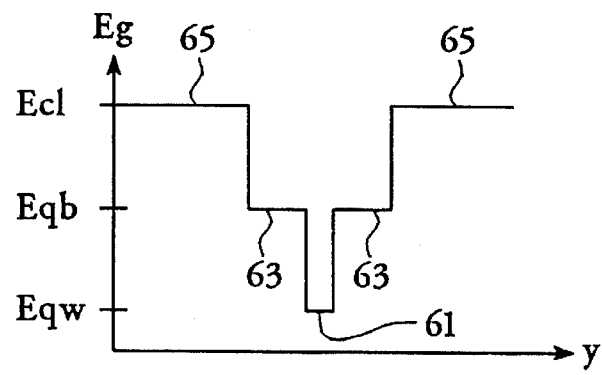
FIGS. 8a–8b are graphs of bandgap energy versus layer depth for two quantum well active region heterostructures with respective high magnitude and low magnitude antiguiding factors $\alpha$.
Figure 8B:
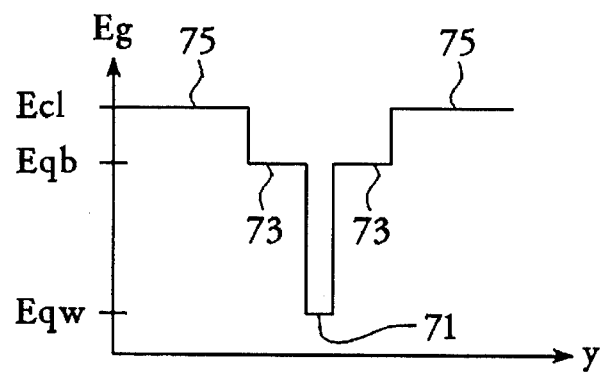

Various other steps can be taken to reduce the magnitude of the self-focusing parameter or antiguiding factor $\alpha$ in a semiconductor amplifying medium. These reduced $\alpha$ materials can be used in combination with the longitudinally inhomogeneous active regions with compensating portions discussed above, or can be used alone in a homogeneous active region to reduce, but not necessarily completely eliminate, filamentation. One such technique is illustrated in FIGS. 8a and 8b. A typical single quantum well (SQW) diode heterostructure for a semiconductor laser or amplifier has an active region with a thin quantum well 61 with a first bandgap energy $E_{qw}$ bounded by carrier confining quantum barriers 63 with a higher second bandgap energy $E_{qb}$. The active region is in turn bounded by optically confining cladding layers 65 of lower refractive index than the active region and generally having an even higher third bandgap energy $E_{cl}$. The quantum well 61 might be composed of $In_xGa_{1-x}As$, where x is typically about 0.08, while the quantum barriers 63 might be composed of GaAs. The barrier height ($E_{qb} - E_{qw}$) is generally about 100 meV. A medium with a reduced antiguiding factor $\alpha$ can be produced by increasing the barrier height. In FIG. 8b, a quantum well 71 with first bandgap energy $E_{qw}$ is bounded by quantum barriers 73 of a fourth bandgap energy $E_{qb}'$ which is even higher than the second bandgap energy $E_{qb}$ for the quantum layers 63 that they replace. The active region of quantum well and barrier layers 71 and 73 is in turn bounded by cladding layers 75 of third bandgap energy $E_{cl}$, which generally is slightly higher than the fourth bandgap energy $E_{qb}'$. The quantum well 71 may be composed of $In_xGa_{1-x}As$, where x is about 0.08, like the quantum well 61 in FIG. 8a. However, here the quantum barriers 73 are now composed of $Al_yGa_{1-y}As$, where y is about 0.10, producing a barrier height ($E_{qb}' - E_{qw}$) of about 170 meV. The increased barrier height improves carrier confinement within the quantum well 71. It is an excess of unpaired unconfined carriers which contributes to an increase in the refractive index without contributing to gain that boosts the magnitude of the antiguiding factor $\alpha$. The compositions given are representative examples, and other compositions with large barrier heights are also possible. Multiple quantumwell heterostructures might also be used.

Recently, growth techniques have been perfected that permit the growth of InGaAs and AlGaAs materials without a growth interrupt or a change of the growth temperature between successive layers. The selected growth temperature is intermediate between the ideal temperatures for each material and reactor flow rates are adjusted to compensate for the less than ideal temperature of growth. Because growth is continuous, no surface oxidation or generation of defects at the boundaries between the quantum well and quantum barrier layers occurs, so that device efficiency is not sacrificed by the growth process.

Figure 9:
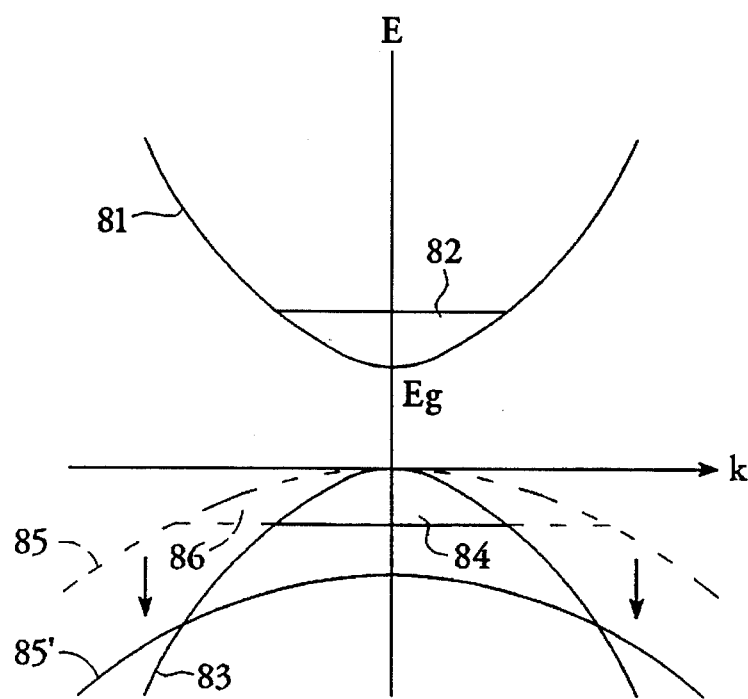
FIG. 9 is a graph of band energy versus wavenumber for conduction and valence bands of a strained quantum well active region. The heavy hole valence band of an unstrained quantum well active region is shown with a dashed curve for comparison.

Referring to FIG. 9, an increase in strain of the active region also reduces the magnitude of the antiguiding factor $\alpha$. The band structure of a typical semiconductor amplifying material includes a conduction band 81 with a lowest energy $E_g$ relative to the peak energy (E=0) of a valence band 83. Elevation of electron carriers from a ground state in the valence band to an excited state in the conduction band, typically by means of electrical current injection across a diode junction, creates a population of excited electrons 82 in the conduction band and leaves a corresponding population of holes 84 in the valence band(s). A typical medium with an unstrained active region has a second lower mobility valence band 85 which is degenerate with the higher mobility valence band 83. The second valence band 85 is occupied by a population of "heavy" holes 86 which recombine with excited electrons with greater difficulty. This creates an excess of carriers that contribute significantly to the refractive index of the medium without contributing very much to the gain, since most of the recombinations are between the electrons and the "light" holes. Straining the active region separates the light (high mobility) and heavy (low mobility) valence bands so that the heavy band 85' is at an energy that no longer contributes in any significant way to the hole population. The antiguiding factor $\alpha$ is therefore reduced. Strain may be produced by any of numerous known methods, including compositional changes involving an increase in the amount of indium in the quantum well or wells or by compositional changes in adjacent layers. Different portions of the active region might be formed with differing self-focusing parameters by providing different amounts of tensile or compressive strain to the respective portions.

Yet another way of reducing the antiguiding factor $\alpha$ is to offset the imbalance in the density of states of electrons and holes by doping a quantum well or other active layer with p-type dopants, such as boron. The p-type dopant material may be dispersed either in the quantum well itself, or preferably, in a hole donor region in close proximity to the quantum well. This provides a ready supply of holes which can be collected in the adjacent quantum well. Use of a plurality of quantum wires or quantum dots spread as an array or matrix over a broad light propagation area for the active region can also provide a more atomic-like density of states that reduces the antiguiding factor $\alpha$.

Finally, the wavelength being amplified can be chosen, by injecting light of the desired wavelength, or by selecting laser cavity dimensions and grating feedback parameters, to be shorter than the gain peak of the active region. As seen in FIGS. 7a and 7b, for lower photon energies E (longer wavelengths than the gain peak 91 of a medium $I_p$ the (negative) magnitude of the antiguiding factor $\alpha$ is seen to increase, while the factor α is generally lower (or even positive) for higher photon energies, i.e. shorter wavelengths than the gain peak 91. This is because a smaller fraction of carriers in the conduction band are consumed by stimulated emission (the saturation optical power is larger) at those wavelengths so that refractive index is raised less by a decrease in gain from an incident intensity perturbation.

All of the techniques described herein are useful for the construction of broad area (including flared) gain media for semiconductor lasers and amplifiers that are less susceptible to filamentation. At least a factor of three improvement in diffraction-limited output power is achievable for the homogeneous media with reduced antiguiding factor α or variable filament period, and even larger outputs are achievable with the inhomogeneous media using compensation regions with negative self-focusing.

We claim:

1. A light amplification medium comprising
a semiconductor material having a first portion aligned with a second portion in a light path having an overall gain greater than unity, said first portion characterized by a positive self-focusing parameter and said second portion characterized by a negative self-focusing parameter.

2. The medium of claim 1, wherein said first portion is light amplifying and said second portion is light absorbing.

3. The medium of claim 2, wherein said light amplifying portion has a lowest bandgap energy less than that of said light absorbing portion.

4. The medium of claim 1, wherein said first portion has an antiguiding factor with a smaller magnitude than that of said second portion, wherein said antiguiding factor is a ratio of change in index of refraction per change in gain as a function of carrier density.

5. A light amplification medium comprising
a semiconductor material having a first portion aligned with a second portion in a light path having an overall gain greater than unity, said first portion having a peak filament period that is different than that of said second portion.

6. A light amplification medium comprising
a semiconductor material having a light amplifying portion aligned with a light absorbing portion in a light path having a gain greater than unity, said light amplifying portion characterized by an antiguiding factor of smaller magnitude than that of said light absorbing portion, wherein said antiguiding factor is a ratio of change in index of refraction per change in gain as a function of carrier density.

7. The medium of claim 6, wherein said light amplifying portion has a lowest bandgap energy less than that of said light absorbing portion.

8. The medium of claim 6, wherein said light amplifying portion and said light absorbing portion have an antiguiding factor with an equal sign.

9. The medium of claim 6, wherein an index of refraction of said path is substantially unchanged with an increase in carrier density.

10. A light emitting device comprising
a semiconductor body having a first portion aligned with a second portion along a light amplification path having a gain greater than unity, said first portion characterized by a positive self-focusing parameter and said second portion characterized by a negative self-focusing parameter, wherein said self-focusing parameter is a ratio of change in index of refraction per change in incident optical power, and means for pumping said semiconductor body.

11. The device of claim 10, wherein said first portion is light amplifying and said second portion is light absorbing.

12. The device of claim 11, wherein said light amplifying portion has a lowest bandgap energy less than that of said light absorbing portion.

13. The device of claim 11, wherein said means for pumping includes providing said light amplifying portion with carriers independently from said light absorbing portion.

14. The device of claim 11, wherein said semiconductor body is injected with light to be amplified having a wavelength shorter than that corresponding with a gain peak of said light amplifying first portion of said semiconductor body.

15. The device of claim 10, wherein both said first portion and said second portion are light amplifying.

16. The device of claim 10, wherein said first and second portions are stripes oriented transversely to said path.

17. The device of claim 10, wherein said first and second portions are interspersed in an array.

18. A semiconductor light emitting device comprising
an active region having means for amplifying light propagating along a length of said active region for emission in a forward direction, said active region having a width dimension that is, for at least part of the length of the active region, more than ten times greater than a wavelength of said light, said active region also having means for suppressing the filamentation growth rate of said light in said active region, cladding regions sandwiching said active region and having a lower refractive index for guiding said light within said active region, means for pumping said active region.

19. The device of claim 18, wherein said active region allows divergence of said light as said light propagates in said active region in said forward direction.

20. The device of claim 19, wherein said active region is flared with an increasing width dimension in said forward direction.

21. The device of claim 18, wherein said active region includes p-type impurities dispersed in a quantum well.

22. The device of claim 18, wherein said active region comprises a quantum well, p-type impurities being dispersed in a region in close proximity to said quantum well to permit holes to collect in said quantum well.

23. The device of claim 18, wherein said active region includes a strained quantum well.

24. The device of claim 18, wherein said active region comprises a plurality of quantum wires or quantum dots spread over a broad area.

25. The device of claim 18, wherein said active region comprises first and second portions having antiguiding factors with opposite signs, wherein said antiguiding factor is a ratio of change in index of refraction per change in gain as a function of carrier density.

26. The device of claim 18, wherein said active region comprises first and second portions each having a positive self-focusing parameter of a different magnitude, wherein said self-focusing parameter is a ratio of change in index of refraction per change in incident optical power.

27. The device of claim 18, wherein said active region comprises first and second portions, said first portion having a peak filament period that is different than that of said second portion.

28. The device of claim 18, wherein said active region comprises a first portion having a positive self-focusing parameter and a second portion having a negative self-focusing parameter, wherein said self-focusing parameter is a ratio of change in index of refraction per change in incident optical power.

29. The device of claim 28, wherein said first portion is light amplifying and said second portion is light absorbing.

30. The device of claim 28, wherein said first portion has a lowest bandgap energy less than that of said second portion.

31. The device of claim 28, wherein said first and second portions are shaped as stripes oriented transversely to said forward direction.

32. The device of claim 28, wherein said first and second portions are interspersed in an array.

33. The device of claim 28, wherein said means for pumping said active region includes means for electrically pumping said first portion independently of said second portion.

34. The device of claim 18, further comprising means for injecting into said active region light to be amplified having a wavelength shorter than that corresponding with a gain peak of said active region.

35. A method for making a high power semiconductor light emitting device comprising
forming an active region bounded by cladding regions,
reducing a growth rate of any filaments in said active region, including reducing a self-focusing parameter of said active region, wherein said self-focusing parameter is a ratio of change in index of refraction per change in incident optical power.

36. The method of claim 35,
wherein forming an active region bounded by cladding regions includes forming a quantum well, and
wherein reducing the growth rate of any filaments in said active region comprises straining said active region, said strain reducing said self-focusing parameter of said active region.

37. The method of claim 35,
wherein forming an active region bounded by a cladding region includes forming a quantum well, and
wherein reducing the growth rate of any filaments in said active region comprises doping said active material with a p-type dopant.

38. The method of claim 37, wherein said p-type dopant is dispersed in said quantum well.

39. The method of claim 37, wherein said p-type dopant is dispersed in a layer of said active region in close proximity to said quantum well.

40. The method of claim 37 wherein reducing the growth rate of any filaments in said active region also comprises straining said active region, said strain reducing said self-focusing parameter of said active region.

41. The method of claim 35, wherein reducing the growth rate of any filaments comprises disordering a portion of said active material.

42. The method of claim 35, wherein reducing a tendency of said active material to form filaments comprises forming said active region in adjoining first and second portions, said first portion having a self-focusing parameter with an opposite sign from that of said second portion, wherein said self-focusing parameter is a ratio of change in index of refraction per change in gain as a function of carrier density.

43. The method of claim 42, wherein said first and second portions are formed with different active material compositions.

44. The method of claim 42, further comprising electronically injecting carriers into said first portion independently of said second portion.

45. The method of claim 35, wherein reducing a tendency of said active material to form filaments comprises forming said active region in adjoining first and second portions, said first portion having a peak filament period substantially different than that of said second portion.

46. The method of claim 35, further comprising injecting light having a wavelength less than that corresponding to a gain peak of said active region.

47. A semiconductor light emitting device, comprising:
an active region having means for amplifying light propagating along a length of the active region, the active region having, for at least a portion of the length thereof, a width capable of supporting multimode propagation of the light therein, and
means for suppressing optical filament growth in the multimode portion of the active region through a reduction of its antiguiding ($\alpha$) factor, wherein the antiguiding factor characterizing any particular portion of the active region is defined as a ratio of change in index of refraction per change in gain as a function of carrier density.

48. A device according to claim 47, in which the active region has a width dimension that is, for at least part of its length, more than ten times greater than a wavelength of the light propagating therein.

49. A device according to claim 47, in which said filament suppressing means includes p-type impurities dispersed in a hole donor region outside of but in close proximity to the active region to permit holes to collect in the active region.

50. A device according to claim 47, in which said filament suppressing means includes p-type impurities dispersed in the active region to provide an abundance of holes thereto.

51. A device according to claim 47, in which said filament suppressing means includes means for providing strain in the active region.

52. A device according to claim 47, in which said filament suppressing means includes a construction for said active region having first and second portions characterized by antiguiding factors with opposite signs.

53. A device according to claim 52, in which the first and second portions of the active region have different bandgap energies, the device further including means for selecting a wavelength of the light propagating in the active region such that said wavelength is shorter than that corresponding to a gain peak of the lower bandgap portions of the active region.

54. A device according to claim 47, in which said filament suppressing means includes a construction for said active region having first and second portions characterized by different peak filament periods.

55. A device according to claim 47, in which said filament suppressing means includes a construction for said active region having first and second portions characterized by self-focusing parameters with opposite signs.

56. A semiconductor light emitting device, comprising:
an active region having means for amplifying light propagating along a length of the active region, wherein one portion of the active region is wider than another portion thereof, and
means for suppressing optical filament growth in the active region through a reduction of its antiguiding ($\alpha$) factor, wherein the antiguiding factor characterizing any particular portion of the active region is defined as a ratio of change in index of refraction per change in gain as a function of carrier density.

57. A device according to claim 56, in which the active region has a width dimension that is, for at least part of its length, more than ten times greater than a wavelength of the light propagating therein.

58. A device according to claim 56, in which said filament suppressing means includes p-type impurities dispersed in a hole donor region outside of but in close proximity to the active region to permit holes to collect in the active region.

59. A device according to claim 56, in which said filament suppressing means includes p-type impurities dispersed in the active region to provide an abundance of holes thereto.

60. A device according to claim 56, in which said filament suppressing means includes means for providing strain in the active region.

61. A device according to claim 56, in which said filament suppressing means includes a construction for said active region having first and second portions characterized by antiguiding factors with opposite signs.

62. A device according to claim 61, in which the first and second portions of the active region have different bandgap energies, the device further including means for selecting a wavelength of the light propagating in the active region such that said wavelength is shorter than that corresponding to a gain peak of the lower bandgap portions of the active region.

63. A device according to claim 56, in which said filament suppressing means includes a construction for said active region having first and second portions characterized by different peak filament periods.

64. A device according to claim 56, in which said filament suppressing means includes a construction for said active region having first and second portions characterized by self-focusing parameters with opposite signs.

* * * * *

UNITED STATES PATENT AND TRADEMARK OFFICE
CERTIFICATE OF CORRECTION

PATENT NO. : 5,657,157
DATED : Aug. 12, 1997
INVENTOR(S) : Robert J. Lang et al.

It is certified that error appears in the above-identified patent and that said Letters Patent is hereby corrected as shown below:

Col. 8, line 44, "bandgap are shown" should read -- bandgap $E_{g2}$ are shown --.

Col. 9, line 12, the equation "$\sigma=(e/hc)\cdot(\lambda/\rho_{int})$" should read -- $\sigma = (e/hc) \cdot (\lambda/\eta_{int})$ --.

Col. 9, line 15, "$\rho_{int}$" should read -- $\eta_{int}$ --.

Signed and Sealed this

Third Day of March, 1998

Attest:

Attesting Officer

BRUCE LEHMAN

Commissioner of Patents and Trademarks